United States Patent
Nikitin et al.

(10) Patent No.: US 9,935,605 B2
(45) Date of Patent: Apr. 3, 2018

(54) SYSTEMS AND METHODS FOR POWERING AND COMMUNICATING WITH WIRELESS SENSOR DEVICES USING BUILDING ELECTRICAL WIRING

(71) Applicant: INTERMEC IP CORP., Everett, WA (US)

(72) Inventors: Pavel Nikitin, Seattle, WA (US); Stephen J. Kelly, Marion, IA (US)

(73) Assignee: INTERMEC IP CORP., Lynnwood, WA (US)

( * ) Notice: Subject to any disclaimer, the term of this patent is extended or adjusted under 35 U.S.C. 154(b) by 47 days.

(21) Appl. No.: 14/878,627

(22) Filed: Oct. 8, 2015

(65) Prior Publication Data

US 2017/0104467 A1    Apr. 13, 2017

(51) Int. Cl.
| | |
|---|---|
| H01F 38/00 | (2006.01) |
| H03H 7/38 | (2006.01) |
| H04B 5/00 | (2006.01) |
| H01F 38/14 | (2006.01) |
| H02J 50/10 | (2016.01) |
| H02J 50/40 | (2016.01) |

(52) U.S. Cl.
CPC ............... *H03H 7/38* (2013.01); *H01F 38/14* (2013.01); *H02J 50/10* (2016.02); *H02J 50/40* (2016.02); *H04B 5/0062* (2013.01)

(58) Field of Classification Search
CPC .................................................. H04W 4/008
USPC ..................... 455/41.1, 41.2, 41.3
See application file for complete search history.

(56) References Cited

U.S. PATENT DOCUMENTS

| | | | |
|---|---|---|---|
| 5,705,974 A | 1/1998 | Patel et al. | |
| 6,175,860 B1 | 1/2001 | Gaucher | |
| 7,307,511 B2 | 12/2007 | Kline | |
| 7,996,879 B1* | 8/2011 | Fang | G06F 21/35 |
| | | | 709/223 |
| 8,483,656 B2 | 7/2013 | Black | |
| 8,788,191 B1 | 7/2014 | Stuntebeck et al. | |
| 9,760,853 B2* | 9/2017 | Rose | G06Q 10/08 |
| 2004/0142599 A1* | 7/2004 | Cope | H04B 5/00 |
| | | | 439/620.09 |

(Continued)

FOREIGN PATENT DOCUMENTS

WO    99/25098 A1    5/1999

OTHER PUBLICATIONS

Mullins et al; "Analog Front-End Design for a Narrowband Power-Line Communications Modem Using the AFE031;" Texas Instruments; Application Report; SBOA130A; Oct. 2011; Revised Nov. 2011; pp. 1-36.

(Continued)

*Primary Examiner* — Wen Huang
(74) *Attorney, Agent, or Firm* — Oliff PLC; R. Brian Drozd (57) ABSTRACT

A system and method for powering and communicating with wireless sensors are provided. One system includes a radio-frequency (RF) transmitter configured to transmit at least one of RF power signals or RF communication signals and a coupling circuit configured to couple the RF transmitter to electrical wiring to allow transmission of the RF power signals or the RF communication signals through the electrical wiring. The system also includes a connector configured to couple the RF transmitter to a power outlet of the electrical wiring.

19 Claims, 6 Drawing Sheets

(56) References Cited

U.S. PATENT DOCUMENTS

| | | | |
|---|---|---|---|
| 2007/0155349 A1* | 7/2007 | Nelson | H02J 13/0013 |
| | | | 455/128 |
| 2007/0194914 A1* | 8/2007 | Gates | G08B 13/08 |
| | | | 340/541 |
| 2009/0243397 A1* | 10/2009 | Cook | H02J 5/005 |
| | | | 307/104 |
| 2009/0312046 A1* | 12/2009 | Clevenger | H02J 17/00 |
| | | | 455/522 |
| 2010/0109842 A1* | 5/2010 | Patel | G01S 5/0252 |
| | | | 340/10.1 |
| 2013/0051404 A1 | 2/2013 | Binder et al. | |
| 2014/0167918 A1* | 6/2014 | Stern | G06K 7/0095 |
| | | | 340/10.1 |
| 2015/0084771 A1 | 3/2015 | Nikitin et al. | |
| 2015/0099463 A1* | 4/2015 | Stuntebeck | H04B 5/0018 |
| | | | 455/41.1 |

OTHER PUBLICATIONS

Naderiparizi et al; "WISPCam: A Battery-Free RFID Camera;" IEEE RFID 2015 Conference; ben.ransford.org/papers/rfid15-wispcam.pdf.

Apr. 7, 2017 Office Action issued in British Patent Application No. 1617013.6.

* cited by examiner

SYSTEMS AND METHODS FOR POWERING AND COMMUNICATING WITH WIRELESS SENSOR DEVICES USING BUILDING ELECTRICAL WIRING

BACKGROUND

The varied uses of wireless devices are increasing, particularly the uses for "smart" devices for residential and commercial building applications. When using these devices, wireless communication of electromagnetic radiation signals is used, which may include radio-frequency (RF) signals.

When used in building applications (e.g., smart homes), one highly desirable feature is maintenance free (batteryless) sensor networks. Such sensors can be coupled with the walls of the building. The sensor may be used for many different purposes, such as to monitor room temperature, air temperature, air quality, humidity, stress on joints, moisture in walls (e.g., bathroom walls) or under shingles, flow of water in pipes, force on the roof (e.g., hail impact or weight of snow), damage due to external forces (e.g., damage from wind), carbon monoxide presence, natural gas and air movement in ducts, among many others. Additionally, these sensors can be powered via various energy harvesting technologies, such as solar energy, vibration energy, etc., as well as ambient RF signals (e.g., AM/FM station signals and television signals).

Powering sensors with dedicated RF signals, such as a carrier wave from a radio-frequency identification (RFID) reader, is a very attractive option. However, the range of typical over-the-air RFID systems is limited by a maximum of a few tenths of feet indoors and is highly dependent on the propagation environment (e.g., a tag just around the corner may not be read). Thus, using a typical system may not provide satisfactory or acceptable performance for many smart building applications.

SUMMARY

To overcome these and other challenges, aspects of broad inventive principles are disclosed herein.

In one embodiment, a system is provided that includes a radio-frequency (RF) transmitter configured to transmit at least one of RF power signals or RF communication signals and a coupling circuit configured to couple the RF transmitter to electrical wiring to allow transmission of the RF power signals or the RF communication signals through the electrical wiring. The system also includes a connector configured to couple the RF transmitter to a power outlet of the electrical wiring.

In another embodiment, a system is provided that includes plural wireless sensors mounted within a building and a radio-frequency (RF) communication device. The RF communication device includes (i) a transmitter configured to couple to a power outlet within the building to transmit at least one of RF power signals or RF communication signals to one or more of the plural wireless sensors through electrical wiring within the building to power or communicate with the one or more wireless sensors and (ii) a coupling circuit configured to impedance match the output of the transmitter to the electrical wiring.

In another embodiment, a method is provided that includes configuring a coupling circuit for connection to an AC power line and connecting the coupling circuit between a radio-frequency (RF) transmitter and the AC power line. The method also includes transmitting one of power signals or communication signals to one or more wireless sensors through the AC power line.

DETAILED DESCRIPTION

The exemplary embodiments described herein provide detail for illustrative purposes and are subject to many variations in structure and design. It should be appreciated, however, that the embodiments are not limited to a particularly disclosed embodiment shown or described. It is understood that various omissions and substitutions of equivalents are contemplated as circumstances may suggest or render expedient, but these are intended to cover the application or implementation without departing from the spirit or scope of the claims.

Also, it is to be understood that the phraseology and terminology used herein is for the purpose of description and should not be regarded as limiting. The terms "a," "an," and "the" herein do not denote a limitation of quantity, but rather denote the presence of at least one of the referenced object. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, as will be appreciated by one skilled in the art, aspects of the present disclosure may be embodied as a system, method, or computer program product. Accordingly, aspects of various embodiments may take the form of an entirely hardware embodiment, an entirely software embodiment (including firmware, resident software, micro-code, etc.) or an embodiment combining software and hardware aspects that may all generally be referred to herein as a "circuit," "module", "system" or "sub-system." In addition, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM) or similar DVD-ROM and BD-ROM, an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for one or more embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

At least some of the present disclosure is described below with reference to flowchart illustrations and/or block diagrams of methods, apparatus (systems) and computer program products according to embodiments described herein. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Various embodiments may include a handheld or fixed transmitting device that can be used in many different applications. Accordingly, while various embodiments may be described in connection with transmitting RFID signals, the various embodiments are not so limited. For example, various embodiments may be used to transmit any type of wireless signal to any type of wireless device, such as using RF signals. Additionally, the various embodiments may be used in many different residential, commercial or industrial applications.

Figure 1:
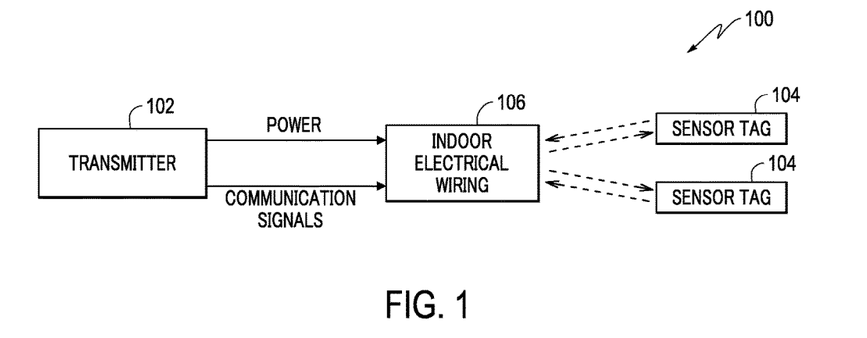
FIG. 1 is a block diagram illustrating a system according to one embodiment.

One or more embodiments may be used, for example, in a smart home or smart building application to provide a maintenance free (battery-less) sensor network. In some embodiments, a system 100 includes a transmitter 102 (which in some embodiments is a transceiver) as shown in FIG. 1 that is configured to provide power and communication to wireless sensors, illustrated as sensor tags 104 (e.g., RFID tags) that can be embedded in the walls or mounted within a building structure. It should be appreciated that although the wireless sensors described herein may be used to perform certain operations or monitoring, different types of sensors may be used. For example, in the embodiment shown in FIG. 1, the sensor tags 104 may be configured to monitor room temperature, air quality humidity, stress on joints, moisture in walls of bathrooms or under shingles, flow of water in pipes, impact on roof from hail, weight of snow, damage from wind, carbon monoxide presence, natural gas, air movement in ducts, etc.

As can be seen in FIG. 1, the transmitter is configured to use the indoor electrical wiring 106 (e.g., AC power lines) in the building as an RF antenna (e.g., UHF RF antenna). For example, in various embodiments, the existing building electrical wiring (AC power lines inside the walls) are used as a leaky RF antenna extending throughout the building to power and communicate with a battery-less wireless sensor network throughout a smart building, such as may be formed by a plurality of the sensor tags 104. In operation, for example, the sensor tags 104 are powered from dedicated UHF RF signals (provided by RFID readers or other RF transmitters) that are coupled to the AC power line forming the indoor electrical wiring 106.

Figure 2:
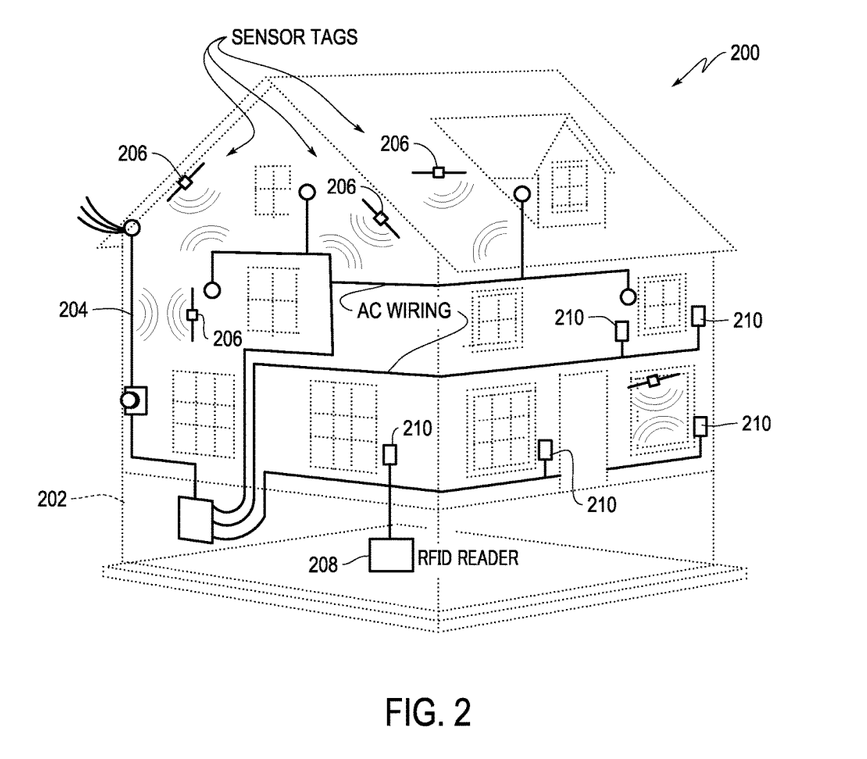
FIG. 2 is a diagram illustrating an RFID building configuration according to one embodiment.

For example, as shown in FIG. 2, a wireless sensor power and communication system 200 may be formed within a building 202, wherein the electrical wiring 204 within the building 202 defines an antenna for wirelessly powering and communicating with a plurality of sensor tags 206. In this embodiment, the transmitter is an RFID reader 208 that is coupled to one of the AC outlets 210 in the building 202. It should be appreciated that although the RFID reader 208 is shown coupled to one particular AC outlet 210, the RFID reader 208 (or other transmitter) may be coupled to any other one of the AC outlets 210. Additionally, one or more additional RFID readers 208 that may be of the same or different type as the RFID reader 208 shown in FIG. 1 may be coupled to other AC outlets 210.

In operation, when the RFID reader 208 (or other RF transmitter) is coupled to one of the AC outlets 210, the RFID reader 208 uses the electrical wiring 204 within the building 202 as an RF antenna to send power and communication signals to the sensor tags 206 located throughout the building 202. The signals may be directed to particular ones of the sensor tags 206 or may be a broadcast signal to all of the sensor tags 206. The RFID reader 208 may, for example, send RF signals via the electrical wiring 204 within the building 202 that gets reradiated and powers the sensor tags 206. The powered sensor tags 206 then respond to the RFID reader 208 via the same propagation channel (air-power line (electrical wiring 204)-coupling circuit-RFID reader 208). Thus, it should be appreciated that in various embodiments, the sensor tags 206 are passive devices powered by the signal received through the electrical wiring 204 within the building 202. However, in other embodiments, the sensor tags 206 may be active devices.

Figure 3:
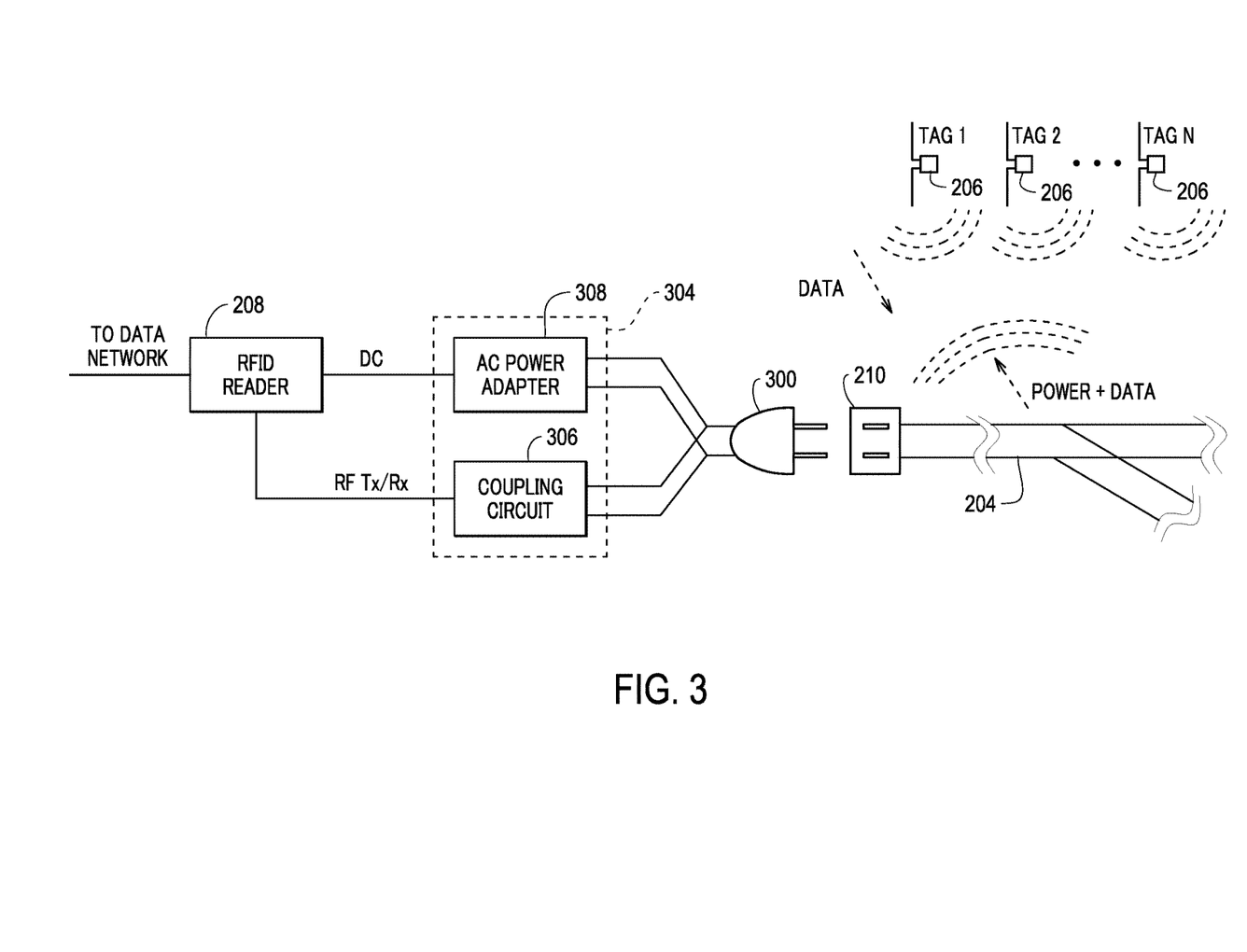
FIG. 3 is a diagram illustrating a transmitter and communication interface according to one embodiment.

As shown in FIG. 3, the RFID reader 208 may be coupled to the AC outlet 210 via a standard plug device 300 (e.g., two prong or three prong electrical plug) that provides power and data signals along the electrical wiring 204 (illustrated as AC electrical wiring) that acts as an RF antenna for communicating between the RFID reader 208 and the sensor tags 206. It should be noted that in various embodiments, the communication may be provided with standard RFID communication signals.

As can be seen in FIG. 3, an interface sub-system 304 is provided that allows the RFID reader 208 to use the electrical wiring 204 as an RF antenna for powering and communicating with the sensor tags 206. The interface sub-system 304 includes a coupling circuit 306 that will be described in more detail herein. The coupling circuit 306 allows the RFID reader 208 to couple signals onto the electrical wiring 204 by providing an impedance matching for the RF signaling (e.g., 50 ohm impedance matching). The interface sub-system 304 also includes an AC power adapter 308 that allows the RFID reader 208 to be powered by the AC outlet 210. For example, the AC power adapter 308 may be any type of adapter configured to convert the AC power from the AC outlet 210 to DC power for powering the RFID reader 208 or other transmitter. Thus, the AC power adapter 308 coverts the AC power to DC power at a level that can be used by the RFID reader 208.

Figure 4:
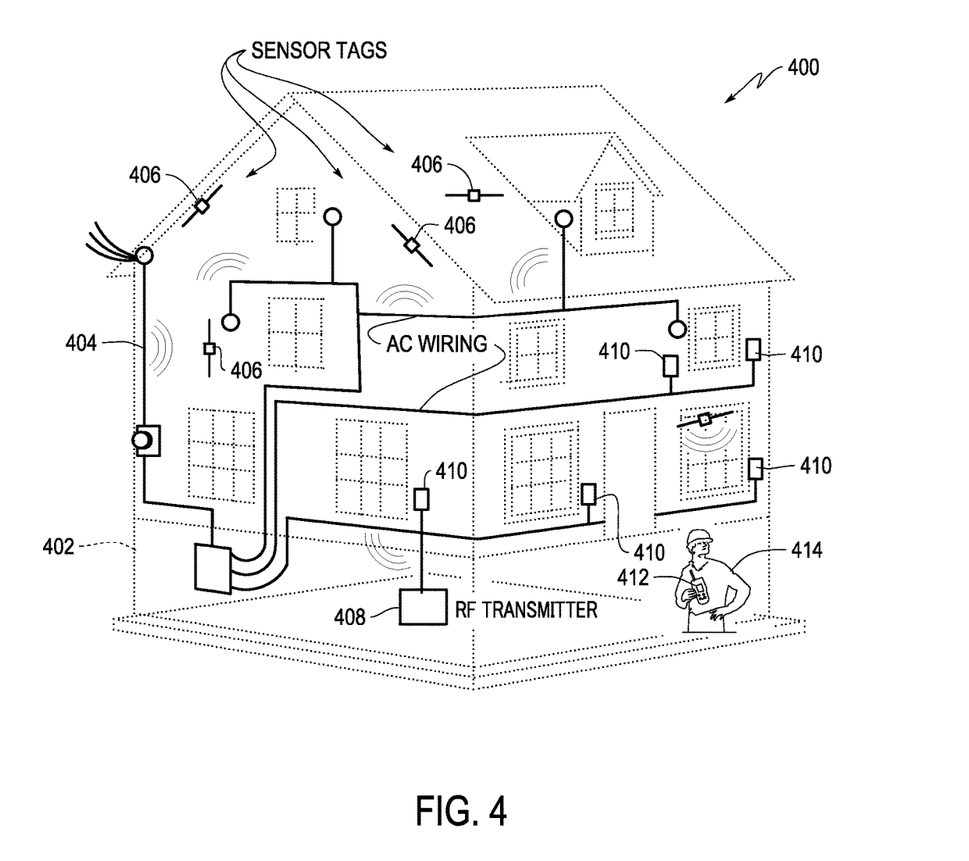
FIG. 4 is a diagram illustrating a wireless transmitter building configuration according to another embodiment.

FIG. 4 illustrates a wireless sensor power and communication system 400 in accordance with another embodiment that may be formed within a building 402, wherein the electrical wiring 404 within the building 402 defines an antenna for wirelessly powering and communicating with a plurality of sensor tags 406. However, unlike the embodiment illustrated in FIG. 2, in the wireless sensor power and communication system 400, low-cost RF transmitters 408 are coupled to one or more AC outlets 410 and used to provide the power (injecting RF into the electrical wiring 404), while one or more RFID handhelds 412 are used by individuals 414 (e.g., personnel) to, for example, walk around the building 402 and periodically read the sensor tags 406.

It should be noted that if many sensor tags 406 are used (e.g., more than 10 sensor tags 406), in various embodiments, backscatter RFID may be used to provide a low cost link. In embodiments where fewer sensor tags 406 are desired or required (e.g., 3-10 sensor tags 406), other technologies instead of backscatter RFID may be used, such as active radio technologies, for example, ANT, Bluetooth Low Energy, etc.

In operation, the sensor tags 406 can harvest energy to an internal storage (such as a super-capacitor) and transmit data when the sensor tag 406 has sufficient charge to transmit. The sensor tags 406 can then be read using, for example, conventional smartphones or tablets. As should be appreciated, if the sensor tags 406 are low enough cost, the sensor tags 406 can be placed in many locations in new construction, providing the homeowner real time information and an inspector additional information that the individuals 414 might normally not be able to "see", improving the information of reports, increasing the value of the property, etc.

In this embodiment, the transmitter is the RF transmitter 408 that is coupled to one of the AC outlets 410 in the building 402. It should be appreciated that although the RF transmitter 408 is shown coupled to one particular AC outlet 410, the RF transmitter 408 (or other transmitter) may be coupled to any other one of the AC outlets 410. Additionally, one or more additional RF transmitter 408 that may be of the same or different type as the RF transmitter 408 shown in FIG. 4 may be coupled to other AC outlets 410.

In operation, when the RF transmitter 408 (or other RF transmitter) is coupled to one of the AC outlets 410, the RF transmitter 408 uses the electrical wiring 404 within the building 402 as an RF antenna to send only power to the sensor tags 406 located throughout the building 406 with the RFID handheld 412 communicating with the powered sensor tags 406. Thus, it should be appreciated that in this embodiment, the sensor tags 406 are passive devices powered by the signal received through the electrical wiring 404 within the building 402. However, in other embodiments, the sensor tags 406 may be active devices.

Figure 5:
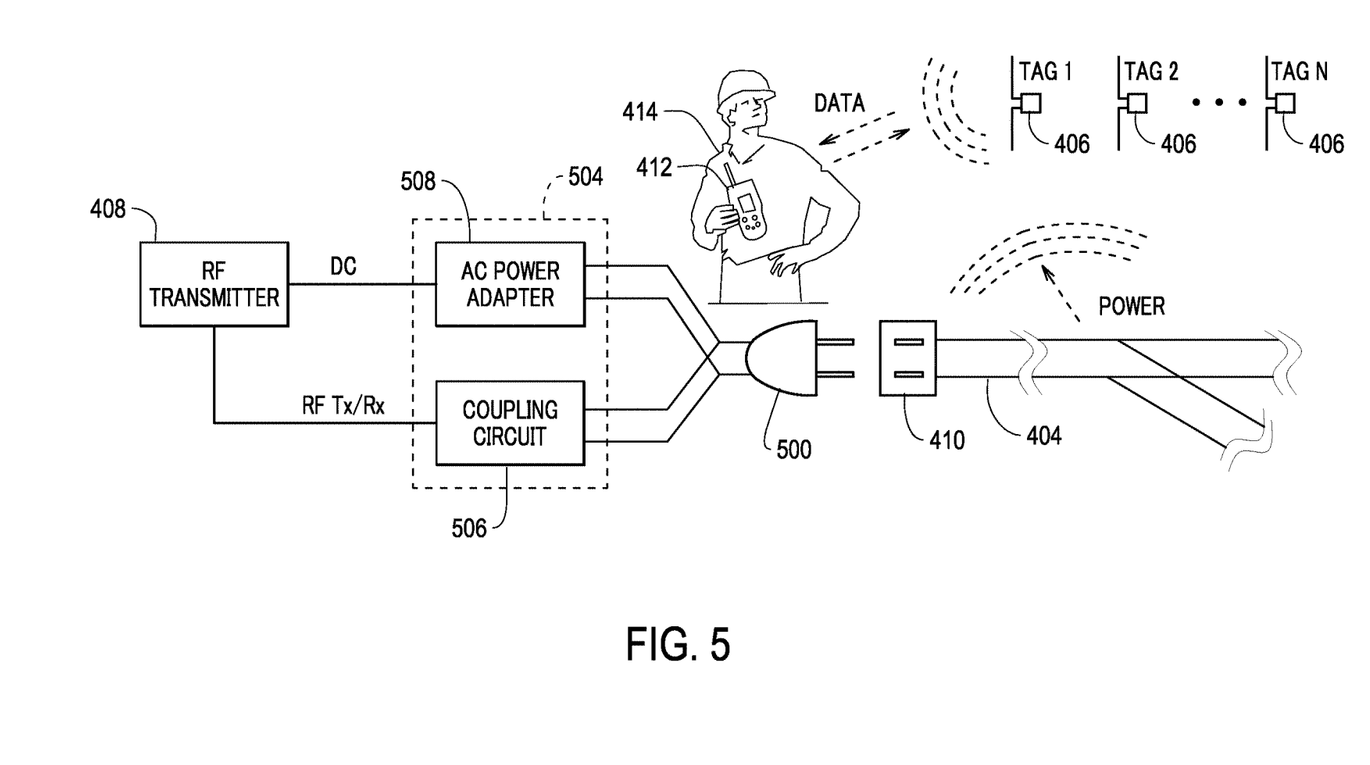
FIG. 5 is a diagram illustrating an arrangement for communicating with UHF RFID tags according to an embodiment.

As shown in FIG. 5, the RF transmitter 408 may be coupled to the AC outlet 410 via a standard plug device 500 (e.g., two prong or three prong electrical plug) that provides power signals along the electrical wiring 404 (illustrated as AC electrical wiring) that acts as an RF antenna for powering the sensor tags 406.

As can be seen in FIG. 5, the system includes an interface sub-system 504 that allows the RF transmitter 408 to use the electrical wiring 404 as an RF antenna for powering the sensor tags 406. The interface sub-system 504 includes a coupling circuit 506 that will be described in more detail herein. The coupling circuit 506 allows the RF transmitter 408 to couple RF power signals onto the electrical wiring 404 by providing an impedance matching for the RF signaling (e.g., 50 ohm impedance matching). The interface sub-system 504 also includes an AC power adapter 508 that allows the RF transmitter 408 to be powered by the AC outlet 410. For example, the AC power adapter 508 may be any type of adapter configured to convert the AC power from the AC outlet 410 to DC power for powering the RF transmitter 408 or other transmitter. Thus, the AC power adapter 508 coverts the AC power to a DC power at a level that can be used by the RF transmitter 408.

It should be appreciated that the various sensor tags described herein may be configured and used for many different applications. For example, one or more of the sensor tags 206 or 406 may be used to monitor strain gauges in earthquake zones (or on bridges), can be used as hail/wind/water damage sensors in hurricane prone areas, etc. Additionally, the sensor tags 206 or 406 may be provided with different types of functionality or other components. For example, the sensor tags 206 or 406 may include switches or actuators to provide control functionalities, such as for vent dampers or sprinkler systems.

Also, in some embodiments where many sensor tags 206 or 406 are placed on or in the wall of a building (e.g., formed as a matrix within the drywall or a grid of passive sensor tags 206 or 406 impregnated within the wall board), the sensor tags 206 or 406 can provide a spatial temperature (or other quantity) map of the wall or other surface. The sensor tags 206 or 406 may additionally be used for security, such as to acquire images. For example, harvested energy in the sensor tags 206 or 406 can be stored in a capacitor or other energy storage device to power a camera and send the images back via a backscatter link. The sensor tags 206 or 406 may also communicate with each other to monitor continuity (e.g., the sensor tags 206 or 406 may "talk" to each other periodically to check status).

Thus, in various embodiments, power line communication systems are provided that do not require both the transmitter and the receiver to be physically coupled (wired into) to the power line. Moreover, passive battery-less sensors may be used that powered by in-building wiring, thereby providing sensor nodes that are maintenance free and that do not need to be powered by batteries.

The sensor tags 206 or 406 in one or more embodiments can be, for example, a standard RFID tag with a dipole-like antenna, placed anywhere on or inside the walls of the building 202 or 402 where the signal strength radiated by the power line is sufficient to power the sensor tags 206 or 406. The RFID reader 208 or RF transmitter 408 can be coupled into the power line using the coupling circuit 306 or 506 that decouples high voltage AC signals, filters unwanted frequencies, and provides a good impedance match for RFID reader RF port (typically, 50 Ohm).

As should be appreciated, one or more embodiments may be implemented using different circuit designs and configured for operation with different types of sensor tags. For example, in some embodiments, the system may be configured for operation in accordance with power line communication circuits as described in "Analog Front-End Design for a Narrowband Power-Line Communications Modem Using the AFE031", TI application note.

Figure 6:
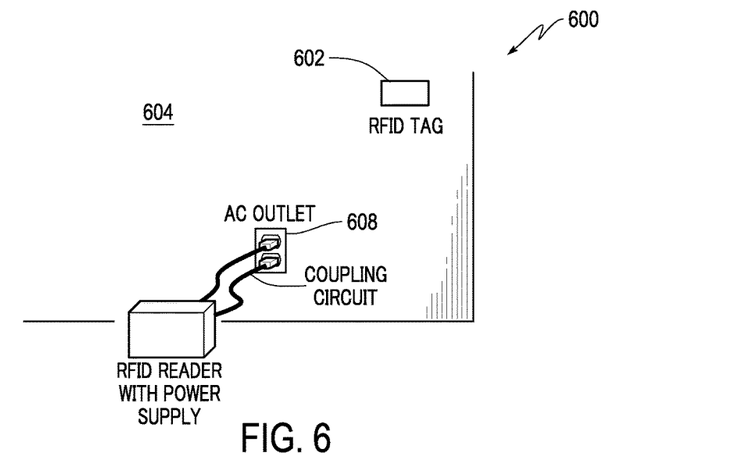
FIG. 6 illustrates an RFID reader configuration according to an embodiment.

For example, as shown in FIG. 6, illustrating a portion of a wireless sensor power and communication system 600, a standard Gen2 tag 602 (KSW with NXP UCODE G2XM IC) with RF sensitivity −12 dBm is mounted on a wall 604 near where electrical wiring (not shown) is located inside the wall 604. In this embodiment, an Intermec IF2 RFID reader 606 is coupled to the AC power line by plugging the reader 606 into the AC outlet 608. In this embodiment, the reader 606 can power and communicate with the RFID tag 602 through the electrical wiring and read, for example, in the 902-928 MHz frequency band. The output power of the reader 606 in one embodiment is 10 dbm. However, other output power levels may be used. Additionally, ground-neutral and ground-phase pairs may be used with the AC outlet 608. By using the wireless sensor power and communication system 600, the RFID tag 602 may be read, for example, around the corner, which is not feasible with conventional over-the-air-transmission.

Figure 7:
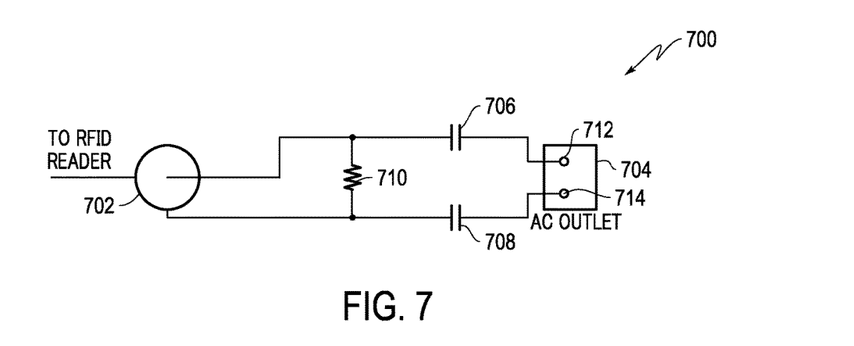
FIG. 7 is a schematic diagram of a coupling circuit according to an embodiment.
Figure 8:
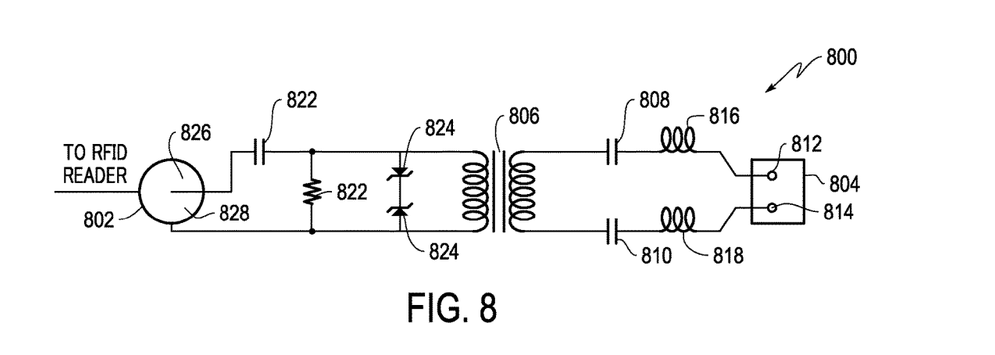
FIG. 8 is a schematic diagram of a coupling circuit according to another embodiment.

The RFID reader 208 or RF transmitter 408 may be coupled into the AC power line using the coupling circuit 700 shown in FIG. 7 or the coupling circuit 800 shown in FIG. 8. It should be noted that the coupling circuit 700 or 800 may be embodied as the coupling circuit 306 or 506 (shown in FIGS. 3 and 5). As illustrated in FIG. 7, the coupling circuit 700 allows an RFID reader 702 (which may be embodied as the RFID reader 208 shown in FIG. 2) to couple with an AC outlet 704 (which may be embodied as the AC outlet 210 shown in FIG. 2). In this embodiment, the coupling circuit 700 includes a pair of capacitors 706 and 708 connected in parallel with a resistor 710 connected in series therebetween. As can be seen, one branch of the coupling circuit 700 is connected to a port 712 of the AC outlet 704 and the other branch of the coupling circuit 700 is connected to a port 714 of the AC outlet 716. The resistor 710 provides an impedance match to the output impedance of the RFID reader 702, and the capacitors 706 and 708 provide a DC block, or a high=pass filter, blocking DC and low frequency components.

In various embodiments, the capacitors are sized to cut off the AC part of the signals and the resistor 710 provides an impedance load for the RFID reader 702. In operation, the capacitors 706 and 708 decouple the high voltage AC to prevent damage to the RFID reader 702. The resistor 710 provides the impedance matching of the very low impedance (a fraction of an ohm) in the electrical wiring in the building and the AC signal that is present, with the impedance of the RF system, for example, 50 ohms. It should be noted that although a dual-socket plug may be used, in other embodiments, a single socket plug may be used to power the RFID reader 702 and send/receive signals into the electrical wiring.

As illustrated in FIG. 8, the coupling circuit 800 allows an RFID reader 802 (which may be embodied as the RFID reader 208 shown in FIG. 2) to couple with an AC outlet 804 (which may be embodied as the AC outlet 210 shown in FIG. 2). In this embodiment, the coupling circuit 800 includes a transformer 806 having a pair of capacitors 808 and 810 on one side connected to the ports 812 and 814 of the AC outlet 804 through corresponding inductors 816 and 818. The other side of the transformer 806 includes a capacitor 820 connected to one terminal 826 of the RFID reader 802 and a resistor 822 and a diode, such as a TVS diode (represented by a pair of opposed Zener diodes 824) connected in parallel across the terminal 826 and a terminal 828 of the RFID reader 802.

The capacitors 808 and 810 in series with the inductors 816 and 818 form a series LC resonant bandpass filters, passing through only the desired frequencies. The transformer 806 provides an effective RF impedance match between the low impedance of the powerline and the high impedance of the RFID reader. The TVS diode and the resistor 822 provide transient voltage surge protection. The capacitor 820 functions as a DC block and can also be used for better impedance matching (imaginary component of the impedance) between the transformer 806 and the RFID reader output.

Figure 9:
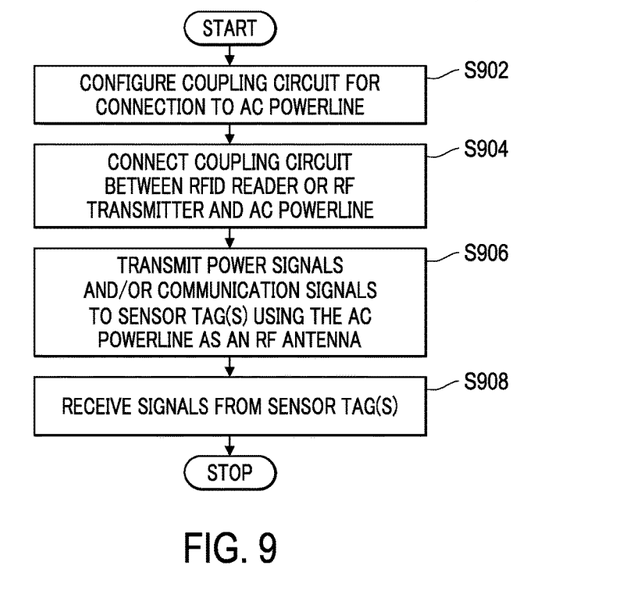
FIG. 9 is a flowchart of a method according to an embodiment.

One or more embodiments include a method 900 as illustrated in FIG. 9. With reference also to FIGS. 1-8, the method 900 may be implemented or performed using one or more systems described herein, such as the system 100, 200, 400 or 600. It should be noted that the steps of the method 900 may be performed in a different order and some steps may be performed concurrently. Additionally, some steps may be repeated.

The method 900 includes configuring a coupling circuit at 902 (e.g., constructing or forming the circuit) for connection to an AC power line. For example, as described herein, the coupling circuit may be configured to decouple AC voltage and provide impedance matching for RF signal communication. The method 900 also includes connecting the coupling circuit between an RFID reader or RF transmitter and an AC power line at 904. For example, as described herein, an RFID reader or RF transmitter may be connected to an AC outlet in a building via the coupling circuit. In some embodiments, the coupling circuit blocks AC signals from returning to the RFID reader or RF transmitter and provides an impedance match for RF communication with the AC power line (e.g., 50 ohm impedance matching).

The method 900 further includes at 906 transmitting power signals and/or communication signals to one or more sensor tags using the AC power line as an RF antenna. For example, as described herein, the RFID reader or RF transmitter may send only power signals to the sensor tags or both power signals and communication signals to the power tags through the AC power line. The method 908 also includes receiving signals from the sensor tags at 908. For example, the return signals from the sensor tags may be received and communicated through the AC power line or may be received by a separate receiver (e.g., RFID reader) not connected to the AC outlet.

It should be noted that the system 100, 200, 400 or 600 can comprise one or more microprocessors (which may be embodied as a processor) and a memory, coupled via a system bus. The microprocessor can be provided by a general purpose microprocessor or by a specialized microprocessor (e.g., an ASIC). In one embodiment, the system can comprise a single microprocessor which can be referred to as a central processing unit (CPU). In another embodiment, the system 100 can comprise two or more microprocessors, for example, a CPU providing some or most of the scanning functionality and a specialized microprocessor performing some specific functionality, such as to determine distance information and correlate that information with the acquired image information. A skilled artisan would appreciate the fact that other schemes of processing tasks distribution among two or more microprocessors are within the scope of this disclosure. The memory can comprise one or more types of memory, including but not limited to: random-access-memory (RAM), non-volatile RAM (NVRAM), etc.

In some embodiments, one or more components may be "smart" components. For example, a smart coupling circuit 1000 as shown in FIG. 10 may be provided that is configured to automatically adapt or adjust in real time to various powerline impedances, such as by using a microcontroller monitoring the impedance match and controlling some of the components in the coupling circuit 1000, such as voltage controlled capacitors, etc.

Figure 10:
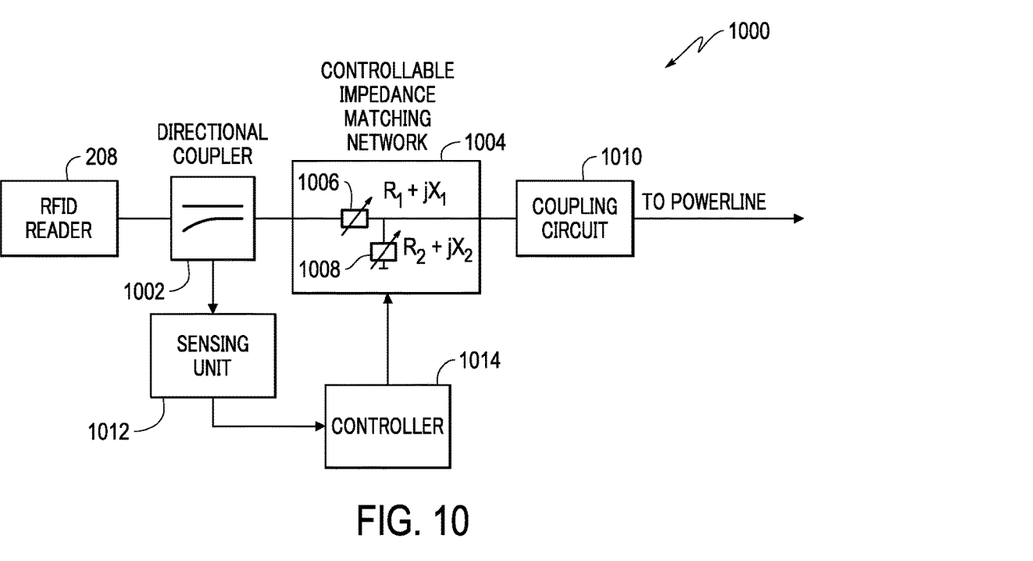
FIG. 10 is a schematic diagram of a coupling circuit arrangement according to an embodiment.

In the embodiment illustrated in FIG. 10, a directional coupler 1002 connected, for example, to the RFID reader 208, directs part of the reflected RF power (part of the reader transmitted signal that gets reflected due to not good impedance matching) into a sensing unit 1012 (e.g., a power sensor) that provides an input to a controller 1014. The controller 1014 controls an impedance matching network 1004 that is coupled to a coupling circuit 1010. It should be noted that the complex impedance elements 1006 and 1008 shown in the impedance matching network 1004 represent a generic manner to implement the circuit. Each of the complex impedance elements 1006 and 1008 may include, for example, a resistor, a capacitor, and/or an inductor, all of which are voltage controlled. It should be noted that additional elements can be provided, for example, a T-matching network, a Pi-matching network, etc.

In operation, when impedance matching is good, a little amount of power is reflected. When the impedance matching is not good, the amount of reflected power increases. In this way, the controller 1014 can adapt the impedance matching in real time, for example, adapting to sudden changes on the powerline (due to users plugging/unplugging/turning on various AC electrical appliances/devices). The coupling circuit 1010 may be embodied, for example, as the coupling circuit 700 (shown in FIG. 7) or the coupling circuit 800 (shown in FIG. 8).

It should be noted that, for example, the various embodiments can provide communication using different standards and protocols. For example, the wireless communication can be configured to support, for example, but not limited to, the following protocols: at least one protocol of the IEEE 802.11/802.15/802.16 protocol family, at least one protocol of the HSPA/GSM/GPRS/EDGE protocol family, TDMA protocol, UMTS protocol, LTE protocol, and/or at least one protocol of the CDMA/IxEV-DO protocol family.

The flowcharts and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The corresponding structures, materials, acts, and equivalents of any means or step plus function elements in the claims below are intended to include any structure, material, or act for performing the function in combination with other claimed elements as specifically claimed. The description of the present disclosure has been presented for purposes of illustration and description, but is not intended to be exhaustive or limited to embodiments in the form disclosed. Many modifications and variations will be apparent to those of ordinary skill in the art without departing from the scope and spirit of embodiments of the disclosure. The embodiments were chosen and described in order to best explain the principles of embodiments and practical application, and to enable others of ordinary skill in the art to understand embodiments with various modifications as are suited to the particular use contemplated.

The foregoing descriptions of specific embodiments have been presented for purposes of illustration and description. They are not intended to be exhaustive or to limit the embodiments to the precise forms disclosed, and obviously many modifications and variations are possible in light of the above teaching. The embodiments were chosen and described in order to best explain principles and practical applications thereof, and to thereby enable others skilled in the art to best utilize the various embodiments with various modifications as are suited to the particular use contemplated. It is understood that various omissions and substitutions of equivalents are contemplated as circumstances may suggest or render expedient, but these are intended to cover the application or implementation without departing from the spirit or scope of the claims. The following claims are in no way intended to limit the scope of embodiments to the specific embodiments described herein.

What is claimed is:

1. A system comprising:
a radio-frequency identification (RFID) reader comprising a radio-frequency (RF) transmitter configured to transmit interrogation signals to one or more RFID tags using electrical wiring as an RF antenna and to receive responses to the interrogation signals from the one or more RFID tags over the electrical wiring; and
a coupling circuit configured to impedance match the RFID reader to the electrical wiring to allow transmission and reception of signals transmitted and received through the electrical wiring from the RFID reader to and from the one or more RFID tags.

2. The system of claim 1, wherein the coupling circuit is configured to automatically adjust an RF impedance match of the output of the RF transmitter to the electrical wiring.

3. The system of claim 1, further comprising at least one wireless sensor tag and wherein the RF transmitter is configured to transmit the RF power signals or the RF communication signals to the at least one wireless sensor tag through the electrical wiring.

4. The system of claim 1, wherein the coupling circuit comprises AC blocking capacitors and an impedance loading resistor.

5. The system of claim 1, wherein the coupling circuit comprises an impedance matching transformer.

6. The system of claim 1, further comprising (i) at least one wireless sensor tag and wherein the RF transmitter is configured to transmit only RF power signals to the at least one wireless sensor tag through the electrical wiring, the power signals from the RF transmitter powering the at least one wireless sensor tag, and (ii) wherein the RFID reader is configured to receive signals from the at least one wireless sensor tag powered by the RF power signals.

7. The system of claim 1, further comprising at least one wireless sensor tag embedded within a wall of a building and wherein the RF transmitter is configured to transmit RF power signals or RF communication signals to the at least one wireless sensor tag through the electrical wiring.

8. The system of claim 1, wherein the RF transmitter is configured to operate in a frequency range of about 902 MHz to about 928 MHz.

9. A system comprising:
a radio-frequency (RF) reader including:
a transmitter configured to couple to a power outlet within a building to transmit at least one of RF power signals or RF communication signals to one or more of a plurality of wireless sensors mounted within a building through electrical wiring within the building to power and communicate with the one or more wireless sensors, wherein the one or more wireless sensors form a series of passive sensor tags and
a coupling circuit configured to impedance match the output of the transmitter to the electrical wiring.

10. The system of claim 9, wherein the RF communication device comprises a connector configured to couple to the power outlet.

11. The system of claim 10, wherein the power outlet is an AC wall outlet and the connector is a standard power plug.

12. The system of claim 9, wherein the transmitter comprises a radio-frequency identification (RFID) reader transmitter.

13. The system of claim 9, wherein the plural wireless sensors comprise radio-frequency identification (RFID) tags.

14. The system of claim 9, wherein the plural wireless sensors comprise smart tags.

15. The system of claim 9, wherein the coupling circuit comprises AC blocking capacitors and an impedance loading resistor.

16. The system of claim 9, wherein the coupling circuit comprises an impedance matching transformer.

17. The system of claim 9, wherein the transmitter is configured to operate in a frequency range of about 902 MHz to about 928 MHz.

18. A method for powering and communicating with wireless sensors, the method comprising:
attaching a coupling circuit to electrical wiring within a structure to couple a radio-frequency identification (RFID) reader to the electrical wiring;
wherein the coupling circuit impedance matches the radio-frequency identification (RFID) reader with the electrical wiring so that the electrical wiring can be used an RF antenna for the RFID reader to send communication signals to wireless sensors and to receive responses to the interrogation signals from the RFID tags
transmitting from the RFID reader the communication signals to one or more wireless sensors through the electrical wiring; and
receiving, at the RFID reader, responses to the communication signals from the wireless sensors.

19. The method of claim 18 further comprising, receiving signals from powered wireless sensors through the electrical wiring.

* * * * *